United States Patent
Portillo et al.

(10) Patent No.: US 11,729,018 B2
(45) Date of Patent: *Aug. 15, 2023

(54) HVAC CONTROLLER AREA NETWORK HYBRID NETWORK TOPOLOGY

(71) Applicant: Trane International Inc., Davidson, NC (US)

(72) Inventors: Ramon Portillo, Tyler, TX (US); Neal Harrington, Tyler, TX (US); Nathan Smith, Whitehouse, TX (US); Caleb A. Davis, Whitehouse, TX (US); Brad T. Wilson, Tyler, TX (US)

(73) Assignee: Trane International Inc., Davidson, NC (US)

( * ) Notice: Subject to any disclaimer, the term of this patent is extended or adjusted under 35 U.S.C. 154(b) by 51 days.

This patent is subject to a terminal disclaimer.

(21) Appl. No.: 17/464,284

(22) Filed: Sep. 1, 2021

(65) Prior Publication Data

US 2021/0399917 A1    Dec. 23, 2021

Related U.S. Application Data

(63) Continuation of application No. 16/424,773, filed on May 29, 2019, now Pat. No. 11,133,957.

(51) Int. Cl.
*H04L 12/28* (2006.01)
*H04L 12/40* (2006.01)
(Continued)

(52) U.S. Cl.
CPC ............. *H04L 12/40* (2013.01); *F24F 11/56* (2018.01); *H03H 7/38* (2013.01); *H04L 12/44* (2013.01); *H04L 2012/40215* (2013.01)

(58) Field of Classification Search
CPC ............. H04L 12/40; H04L 12/44; H04L 2012/40215; H04L 12/2816;
(Continued)

(56) References Cited

U.S. PATENT DOCUMENTS 5,073,982 A   12/1991   Viola et al.
5,140,585 A    8/1992   Tomikawa
(Continued)

FOREIGN PATENT DOCUMENTS

EP    2 166 717 A1    3/2010
WO    00/07258 A1     2/2000

OTHER PUBLICATIONS

NI-CAN Hardware and Software Manual. National Instruments, Austin, TX, Sep. 2014, Chpt. 4:10-12. 705 pages.

*Primary Examiner* — Lan-Huong Truong
(74) *Attorney, Agent, or Firm* — Womble Bond Dickinson (US) LLP (57) ABSTRACT

The present disclosure provides a CAN network topology for an HVAC communication system. The CAN network topology comprises at least three primary nodes having a predetermined termination impedance and a plurality of end nodes coupled to each primary node, wherein the predetermined termination impedance is set to the optimal setting of 180 ohms. Advantageously, the present disclosure eliminates the need for physically setting CAN node terminations. This reduces install time and removes variability of the install settings. Further, removing this variability reduces the risk for post-installation call-backs due to incorrect system setup. The present disclosure optimizes signal slew rate, which improves signal reliability.

20 Claims, 9 Drawing Sheets

(51) Int. Cl.
*H03H 7/38* (2006.01)
*F24F 11/56* (2018.01)
*H04L 12/44* (2006.01)

(58) Field of Classification Search
CPC ...... H04L 12/40006; H04L 2012/4026; H03H 7/38; F24F 11/56
See application file for complete search history.

(56) References Cited

U.S. PATENT DOCUMENTS

| | | | |
|---|---|---|---|
| 5,313,595 A | 5/1994 | Lewis et al. | |
| 5,513,182 A | 4/1996 | Kawamura et al. | |
| 5,734,658 A | 3/1998 | Rall et al. | |
| 5,747,893 A | 5/1998 | Bennett et al. | |
| 6,404,299 B1 | 6/2002 | Avery, Jr. | |
| 6,639,774 B1 | 10/2003 | Stoebele et al. | |
| 6,970,953 B2 | 11/2005 | Gregory et al. | |
| 7,061,926 B2 | 6/2006 | Breinlinger | |
| 8,838,763 B2 | 9/2014 | Grohman | |
| 9,137,042 B2 | 9/2015 | Van Wageningen et al. | |
| 9,529,358 B2 | 12/2016 | Fredriksson | |
| 2006/0088044 A1 | 4/2006 | Hammerl | |
| 2008/0074254 A1 | 3/2008 | Townsend et al. | |
| 2010/0163633 A1 | 7/2010 | Barrett et al. | |
| 2012/0015893 A1 | 1/2012 | Herrwerth et al. | |
| 2012/0158932 A1* | 6/2012 | Grohman | H04L 12/2838 709/223 |
| 2012/0249268 A1 | 10/2012 | Yu | |
| 2012/0293153 A1 | 11/2012 | Garb et al. | |
| 2015/0177342 A1* | 6/2015 | Lips | G01R 33/3664 324/322 |
| 2017/0262394 A1 | 9/2017 | de Haas et al. | |
| 2018/0103473 A1* | 4/2018 | Stevenson | H04W 76/10 |
| 2018/0132933 A1* | 5/2018 | Hancock | A61B 18/1815 |
| 2019/0288870 A1* | 9/2019 | de Haas | H04L 12/40032 |
| 2019/0385057 A1* | 12/2019 | Litichever | H04L 63/14 |

* cited by examiner

HVAC CONTROLLER AREA NETWORK HYBRID NETWORK TOPOLOGY

CROSS-REFERENCE TO RELATED APPLICATION(S)

The present application is a continuation of U.S. patent application Ser. No. 16/424,773, filed on May 29, 2019, entitled HVAC Controller Area Network Hybrid Network Topology, the content of which is expressly incorporated herein by reference in its entirety.

BACKGROUND

1. Technical Field

The present disclosure generally relates to communication systems, and more particularly, to a Controller Area Network (CAN) hybrid network topology for a heating, ventilation, and air conditioning (HVAC) communication system.

2. Background of Related Art

The Controller Area Network (CAN) network protocol provides deterministic communication in complex distributed systems and provides several advantages, such as the ability to assign priority to messages and guarantee maximum latency times, multicast communication with bit-oriented synchronization, system wide data consistenc, multiple master access to the bus, error detection and signaling with automatic retransmission of corrupted messages, and detection of possible permanent failures of nodes and automatic deactivation of defective nodes. Even though a CAN network offers a number of advantages, a common concern is manual electrical termination of network nodes.

Since CAN signals are propagated on a common bus, reflected signals compromise the integrity of the system. For a node to read the bus level correctly it is important that signal reflections be avoided. This is done by terminating the bus line with a termination resistor at both ends of the bus and by avoiding unnecessarily long stub lines of the bus. The highest possible product of transmission rate and bus length line may be achieved by keeping as close as possible to a single line structure and by terminating both ends of the line. However, the method of terminating CAN hardware can vary depending on the physical layer of the hardware. Incorrectly terminated configurations lead to decreased signal quality, especially in field scenarios. Further, adding additional communicating devices to the network often requires the termination resistors be changed.

A CAN HVAC Hybrid Network Topology that eliminates the need for physically setting CAN node terminations and reduces installation time and removes variability of installation settings would be a welcome advance.

SUMMARY

The present disclosure discloses a CAN network topology for a HVAC communication system. The present disclosure provides a termination impedance for high speed communications at three primary nodes of a physically distributed system, e.g. an HVAC system, such that additional communicating devices and products may be added to the network without changing the termination resistors and without material detriment to the signal quality and therefore data throughput of the network.

The CAN network topology comprises at least three primary nodes having a predetermined termination impedance and a plurality of end nodes coupled to each primary node, wherein the predetermined termination impedance is set to the optimal setting of 180 ohms. In another embodiment, the disclosure provides a method for manufacturing a component for the HVAC system. In one embodiment, the method includes: providing at least three primary hubs or nodes; and setting a predetermined termination level at each primary hub.

In another embodiment, a method for providing a CAN Network Topology is disclosed. The method comprises a step of determining at least three primary hubs suitable for installing one or more end nodes. The method further comprises a step providing a predetermined termination level at each primary hub. The method further comprises a step installing one or more end nodes without the need for physically setting node terminations. The method further comprises a step of enhancing signal integrity by optimizing rise and fall times of the end nodes via the predetermined termination level.

Other objects, features and advantages of the present disclosure will become apparent from the following detailed description. It should be understood, however, that the detailed description and the specific examples, while indicating specific embodiments of the disclosure, are given by way of illustration only, since various changes and modifications within the spirit and scope of the disclosure will become apparent to those skilled in the art from this detailed description.

BRIEF DESCRIPTION OF THE DRAWINGS

The embodiments herein will be better understood from the following detailed description with reference to the drawings, in which.

DETAILED DESCRIPTION

A description of embodiments of the present disclosure will now be given with reference to the Figures. It is expected that the present disclosure may be embodied in other specific forms without departing from its spirit or essential characteristics. The described embodiments are to be considered in all respects only as illustrative and not restrictive. The scope of the disclosure is, therefore, indicated by the appended claims rather than by the foregoing description. All changes that come within the meaning and range of equivalency of the claims are to be embraced within their scope. The words "exemplary" and "exemplarily" are used herein to mean "serving as an example, instance, or illustration." Any embodiment described herein as "exemplary" is not necessarily to be construed as preferred or advantageous over other embodiments. The word "example" may be used interchangeably with the term "exemplary." The term "effective" or "effectively" includes target or nominal values within reasonable engineering tolerances that can achieve a desired technical objective.

Disclosed herein is a communications network that is designed to provide a universal plug and play termination scheme that preserves the quality of signals transmitted across the network. As such, technicians do not have to be relied upon to provide matching impedances for communications networks. Instead, the disclosure provides a physical network with predetermined termination levels at three primary hubs of the network to preserve signal quality. Accordingly, components can be manufactured having these predetermined termination impedances to provide a plug and play solution. For example, the predetermined termination impedance may be embedded in electronic controllers at three primary hubs of the communications networks. The controllers may be computing devices designed to direct the operation of a particular component at each node. Interface circuitry of the controllers may include the predetermined termination impedance at three primary nodes of the communications networks. The interface circuitry may include a transceiver of the electronic controllers and a physical interface circuitry for the transceiver.

Advantageously, the communications length between multiple nodes of the disclosed communications network can vary without affecting signal quality. As such, the disclosed network can be used for HVAC systems that have various configurations due to the requirements of individual installation sites. Accordingly, the disclosed communications network can compensate for variable communication lengths between the coupled components. Additionally, the disclosed communications network can compensate for different wire sizes used for interconnecting nodes of the network. As such, the provided communications network is wire size-agnostic.

Figure 1:
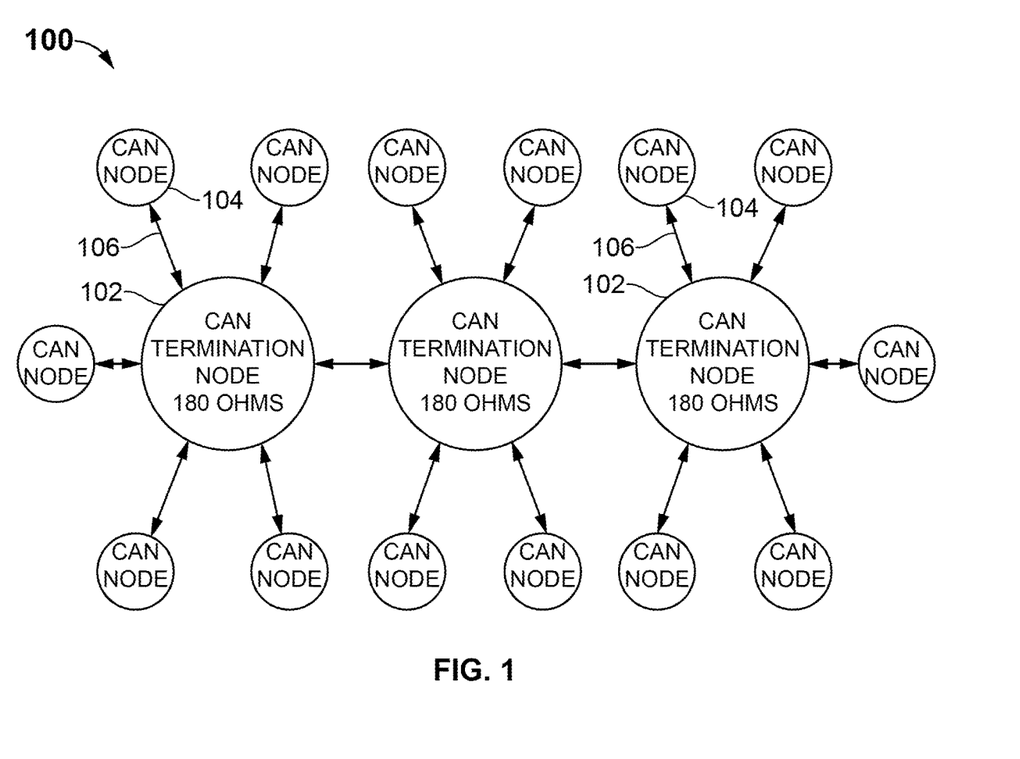
FIG. 1 illustrates a CAN network configuration according to an exemplary embodiment of the present disclosure.

FIG. 1 illustrates a network topology diagram 100 of an embodiment of a CAN network constructed according to the principles of the present disclosure. The network topology diagram provides a layout of interconnections of the various elements (e.g., nodes) of the CAN network. The CAN network may be a communications network within a structure. For example, the CAN network may be a building automation communications network (BACNet) that provides a medium for communications within one or more buildings between coupled components of the communications network.

The CAN network comprises at least three primary nodes 102 and a plurality of end nodes 104. In one embodiment, the CAN network may be a communications network for an HVAC system. As such, the at least three primary nodes 102 and the plurality of end nodes 104 may be the components of the HVAC system.

Each of the primary nodes 102 includes a transceiver circuit having a similar effective termination impedance. More specifically, the terminations of each of the three primary nodes 102 is set to 180 ohms. In one embodiment, the primary node 102 and the plurality of end nodes 104 may be electronic controllers of each component at the particular nodes. As such, the transceiver circuit of each node may be the transceiver circuit of the electronic controllers.

The primary node 102 is coupled to each of the plurality of end nodes 104 by one of a network interconnect or interconnection 106 to form a physical network topology.

The interconnections 106 provide a differential communication bus between nodes (102, 104) of the CAN network. The primary node 102 has usually the highest number of interconnections 106 connected to it. In one embodiment, the interconnections 106 may be copper wire.

The CAN network comprises a physical hybrid topology of star and mesh. The primary node 102 is established as a control node for the CAN network and has a predetermined impedance. The predetermined impedance may also be embedded in an electronic controller at the primary node 102. In one embodiment, the predetermined impedance has a resistance within a range of 50 ohms to 200 ohms. The predetermined impedance can allow various wire sizes to be used for the interconnections 106. As such, the communications network is a wire size-agnostic network.

In one embodiment, the predetermined impedance is based upon, at least in part, a characteristic of a transceiver at the primary node 102. The characteristic may be an operating parameter of the transceiver. The characteristic may be a current limit, a voltage limit, a capacitance limit or a DC load limit for the transceiver. The transceiver may be a Bosch Controller Area Network (CAN) compliant transceiver. The CAN transceiver may comply with various CAN specifications, including revision 2 or ISO-11898. In another embodiment, the transceiver may be an RS-485 compliant transceiver. The RS-485 transceiver may comply with various versions of transceivers for an RS-485 network. With predetermined impedances, the CAN network preserves the quality of signals traversing thereon and substantially reduces or eliminates reflections at the connections of the interconnections 106 with the primary node 102 and the plurality of end nodes 104.

The three predetermined termination points and impedance values are configured to provide enhanced signal integrity by optimizing rise and fall times for a variety of user configurations. Also, this configuration eliminates the need for switches, relays, or other means of configuring nodes. In another embodiment, the disclosure provides a method for manufacturing a component for the HVAC system. In one embodiment, the method includes providing at least three primary hubs and setting a predetermined termination level at each primary hub.

Figure 2:
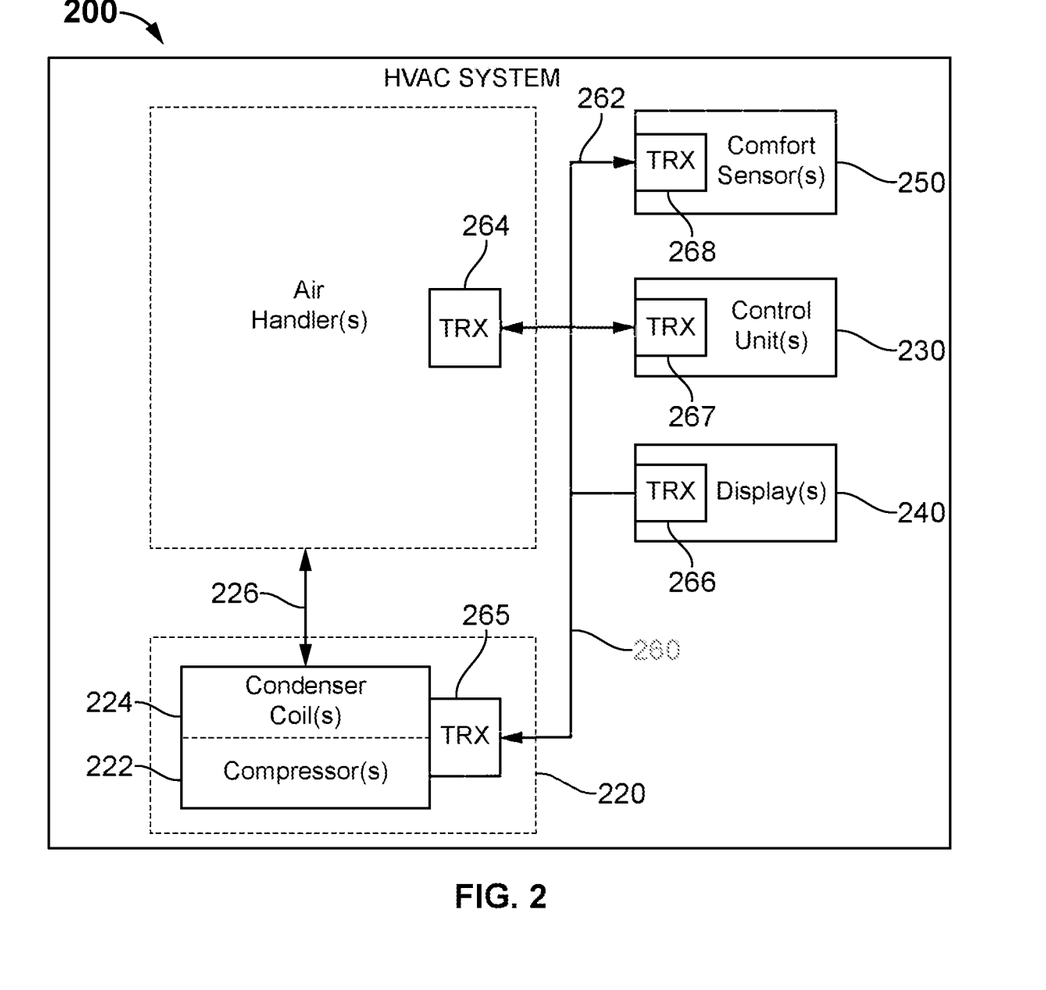
FIG. 2 illustrates a high-level block diagram of a HVAC system constructed according to an exemplary embodiment of the present disclosure.

FIG. 2 illustrates a high-level block diagram of an exemplary HVAC system 200 constructed in accordance with the present disclosure. The HVAC system 200 includes a communications network as discussed with respect to FIG. 1. As such, the HVAC system 200 includes a communications network 260 that couples together the various components of the HVAC system 200.

The HVAC system 200 includes an air handler 210 that is configured to condition and circulate air for the HVAC system 200. The air handler 210 may include heating and/or cooling elements to condition air, and a blower to move the air through the HVAC system 200 and into an enclosure. As such, the air handler 210 may include a furnace and or evaporator coils. Additionally, the air handler 210 may be associated with an outdoor unit 220. Typically, the air handler 210 is an indoor unit. The outdoor unit 220 may include a compressor 222 and associated condenser coils 224 that are typically connected to an associated evaporator coil in the air handler 210 by a refrigerant line 226. One skilled in the art will understand that the HVAC system 200 may include multiple air handlers and, therefore, include multiple associated components as indicated in FIG. 2. Descriptions of FIG. 2, however, will only refer to one of the components. Additionally, one skilled in the art will understand that the HVAC system 200 may include additional components, such as dampers, a thermostat, heat recovery ventilator (HRV), energy recovery ventilator (ERV), and so forth, that are not illustrated or discussed but may be included in an HVAC system.

A control unit 230 controls the air handler 210 and/or the compressors 222 to regulate the temperature of the premises. The display 240 can provide additional functions such as operational, diagnostic and status message displays and a visual interface that allows a technician to perform actions with respect to the HVAC system 200 more intuitively.

A comfort sensor 250 may be associated with the display 240 and may also optionally be associated with the control unit 230. The comfort sensor 250 provides environmental data, e.g. temperature, humidity, and/or barometric pressure, to the control unit 230. The comfort sensor 250 may be physically located within a same enclosure or housing as the control unit 230, in a manner analogous with a conventional HVAC thermostat. In that case, the comfort sensor 250 and the control unit 230 may share the same transceiver circuit. In other embodiments, the comfort sensor 250 may be located separately and physically remote from the control unit 230.

The HVAC system 200 also includes communications network 260 that is configured to provide a communication medium between or among the aforementioned components of the HVAC system 200. Accordingly, the communications network 260 couples the air handler 210, the outdoor unit 220, the control unit 230, the display 240 and the remote comfort sensor 250 such that data may be communicated therebetween or there among. The data may be control data. Additionally, the communications network 260 may be advantageously employed to convey one or more alarm messages or one or more diagnostic messages. Each of the components of the HVAC system 200 includes a transceiver that is configured to communicate (transmit and receive) data over the communications network 260. That transceiver, together with other associated components comprises the transceiver circuit.

The communications network 260 includes interconnections 262 and the various transceiver circuits 264, 265, 266, 267 and 268. The communications network 260 is a CAN network as discussed with respect to FIG. 1. One of the components, or more specifically, one of the transceiver circuits thereof, may be designated as the primary node. For example, the transceiver circuit 264 may be designated as the primary node. The other transceiver circuits 265, 266, 267 and 268, may therefore be designated as end nodes.

Figure 3:
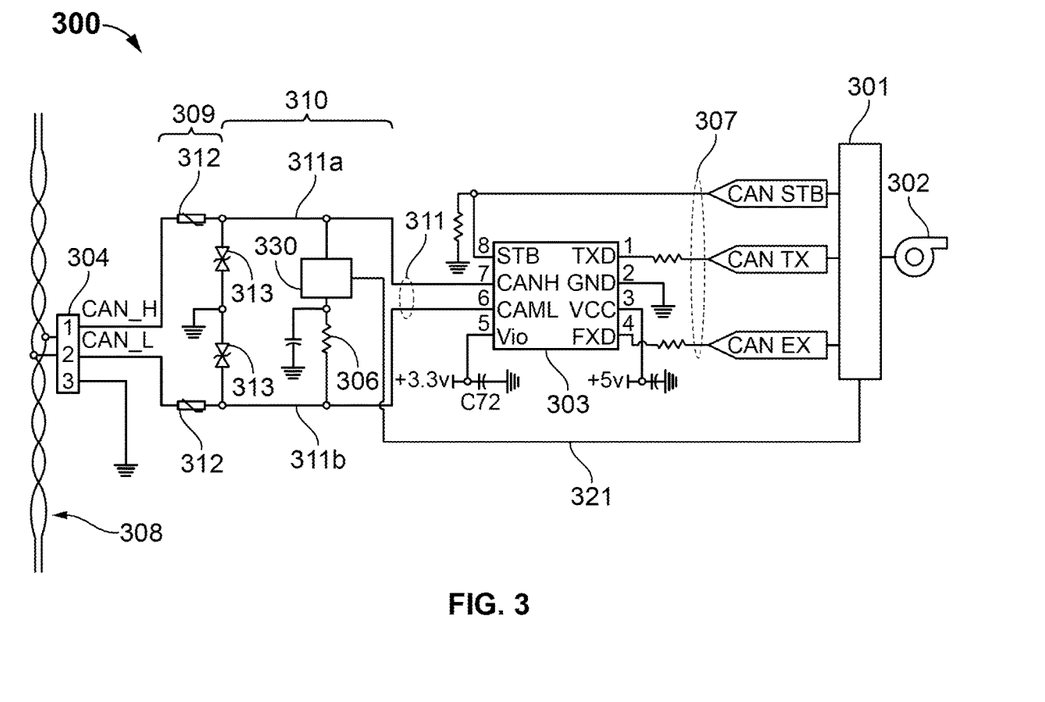
FIG. 3 illustrates a transceiver circuit according to an exemplary embodiment of the present disclosure.

At least some of the transceiver circuits of the communications network 260 may be part of a local controller (not illustrated) for each particular component. Local controllers are electronic controllers that may be configured to provide a physical interface for the communications network 260 and provide various functions related to network communication. A representative controller for each component of the HVAC system 200 is illustrated in FIG. 3. The controller 230 may be regarded as a special case of an electronic controller, in which the controller 230 has additional functionality enabling it to control operation of the various networked components, to manage aspects of communication among the networked components, or to arbitrate conflicting requests for network services among these components.

Turning now to FIG. 3, a transceiver circuit with predetermined termination impedance is disclosed. The transceiver circuit includes a RS-485 transceiver 300 having a device controller 301. The device controller 301 includes a processor, memory, interface circuitry, and operating software to monitor and control the operation of HVAC system or device 302. The operating software may be embodied in a set of instructions stored in the memory and executable on the processor. Device controller 301 is communicatively coupled via controller signal lines 307 to CAN bus interface 303 which provides an interface between device controller 301 and CAN bus signal lines 311 to communicate BAS data between network media 208 and device controller 201 using the CAN bus protocol. CAN bus interface 303 may be an integrated circuit (IC) such as, without limitation, a "TJA1042 High-Speed CAN Transceiver with Standby Mode" manufactured by NXP Semiconductors N.V. of Eindhoven, The Netherlands. CAN bus signal lines 311 include CAN high line 311a and CAN low line 311b in a balanced pair configuration. Protection circuit 309 is interposed between CAN bus signal lines 311 and CAN bus network 308 and includes overcurrent limiting devices 312 and overvoltage limiting devices 313 to protect RS-485 transceiver 300 from harmful electrical transients which may occur on CAN bus network 308.

In the present exemplary embodiment, overcurrent limiting device 312 include a pair of positive temperature coefficient (PTC) thermistors coupled in series, respectively, on each leg of CAN bus signal lines 311 between CAN bus network 308 and CAN bus interface 303. Overcurrent limiting device 312 may additionally or alternatively include a fuse, fusible link, circuit breaker, or other suitable current protection circuit. Overvoltage limiting device 312 may include a Zener diode configured to shunt CAN bus signal line 311 to ground during an overvoltage condition. In some embodiments, overvoltage limiting device 312 may additionally or alternatively include a metal oxide varistor (MOV) or other suitable voltage protection circuit. A connector 304, such as a terminal block or other electrical connector couples RS-485 transceiver 300 to CAN bus network 308.

RS-485 transceiver 300 includes a termination resistor circuit 310 having a termination resistor 306. Termination resistor 306 may be selectively coupled to the CAN bus, e.g., between CAN high line 311a and CAN low line 311b, via electronic switch 330. In the present embodiment, termination resistor 306 has a value of 180Ω, however, the present disclosure is not so limited and therefore termination resistor 306 may have any desired value. In another embodiment, the termination resistor 306 has a value of 50 ohms to 200 ohms.

Figure 4:
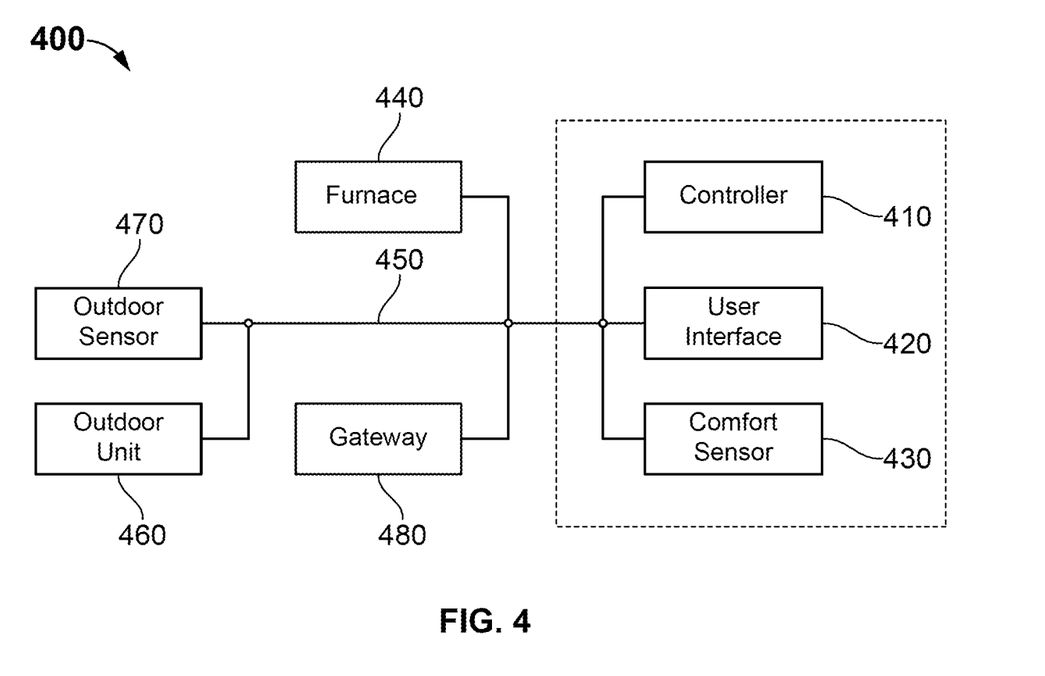
FIG. 4 illustrates a high-level block diagram of a HVAC communications network constructed according to an exemplary embodiment of the present disclosure.

FIG. 4 illustrates a high-level block diagram of an embodiment of a HVAC communications network 400 constructed according to the principles of the disclosure. The network 400 includes multiple nodes coupled together via interconnections 450. The interconnections may be formed from copper wire. For example, the interconnections 450 may be a 4-wire cable. The nodes of the communications network 400 may be controllers (not explicitly shown) of the various illustrated components. The controllers may include transceiver circuits to direct communications via the communications network 400 and provide terminations for the interconnections 450. One of the components, or a controller thereof, may be designated a primary node wherein the remaining components are end nodes. The components include a controller 410, a user interface 420, a comfort sensor 430 and a furnace 440 configured to communicate over the interconnections 450. In some embodiments these devices form a minimal HVAC network. In addition, the network 400 is illustrated as connecting an outdoor unit 460, an outdoor sensor 470, and a gateway 480. The transceiver of each of these components may be coupled to the interconnections 450 to form the communications network 400.

The controller 410 is configured to control the furnace 440 and the outdoor unit 460 using command messages sent via the interconnections 450. The controller 410 may receive environmental data, including temperature, relative humidity and/or barometric pressure, from the comfort sensor 430, the furnace 440, the outdoor sensor 470 and/or the outdoor unit 460. The data may be transmitted over communications network 400 by way of messages formatted for this purpose. The user interface 420 may include a display and input means to communicate information to, and accept input from, an operator or manager of the network 400. The display and input means may be a touch-sensitive display screen.

The controller 410, comfort sensor 430 and user interface 420 may optionally be physically located within a control unit 490. The control unit 490 provides a convenient terminal to the operator to effect operator control of the system. In this sense, the control unit is similar to the thermostat used in conventional HVAC systems. However, the control unit 490 may only include the user interface 420, with the controller 410 and comfort sensor 430 remotely located from the control unit 490.

The controller 410 may control HVAC functionality, store configurations, and assign addresses during system auto configuration. The user interface 420 provides a communication interface to provide information to and receive commands from a user. The comfort sensor 430 may measure one or more environmental attributes that affect user comfort, e.g., ambient temperature, relative humidity, and barometric pressure. The three logical devices 410, 420, 430 each send and receive messages over the communications network 400 to other devices attached thereto, and have their own addresses on the network 400.

Figure 5:
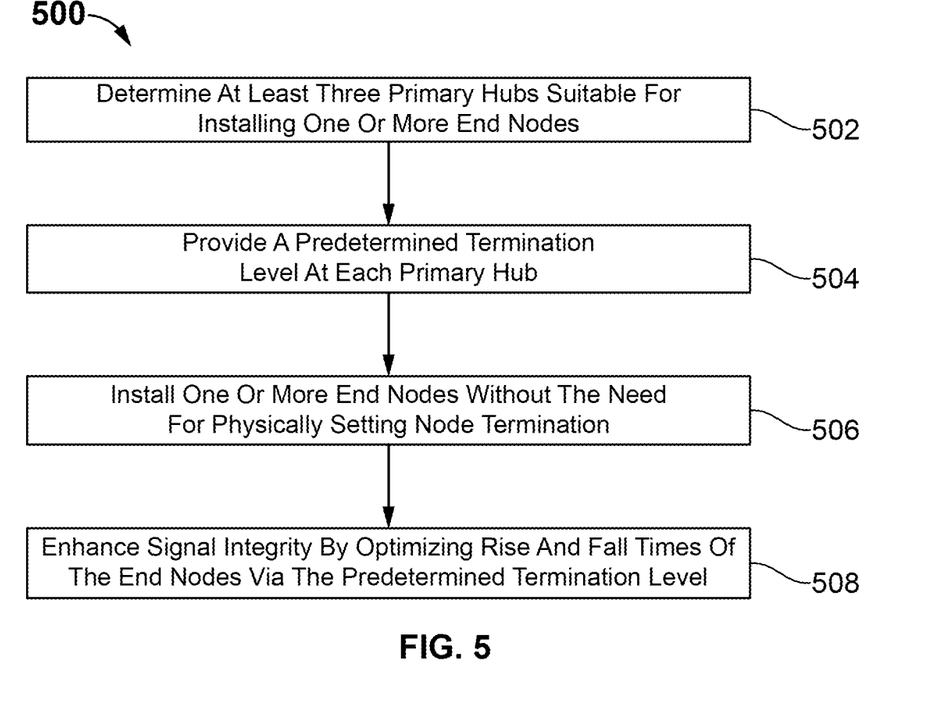
FIG. 5 illustrates a flowchart for providing a CAN Network Topology according to an embodiment of the present disclosure.
Figure 6A:
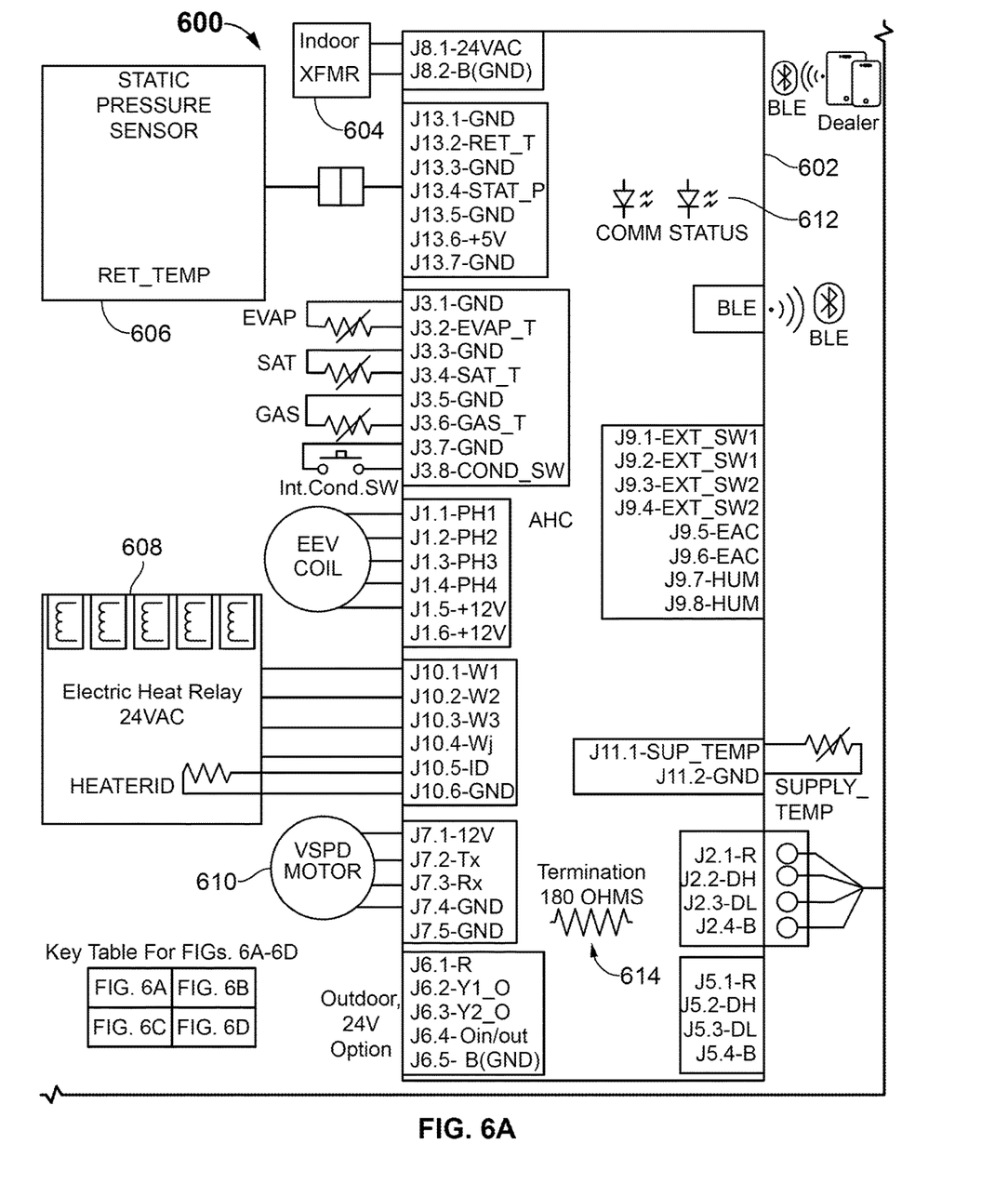
FIGS. 6A-6D illustrate a wiring diagram of a HVAC system according to an exemplary embodiment of the present disclosure.
Figure 6B:
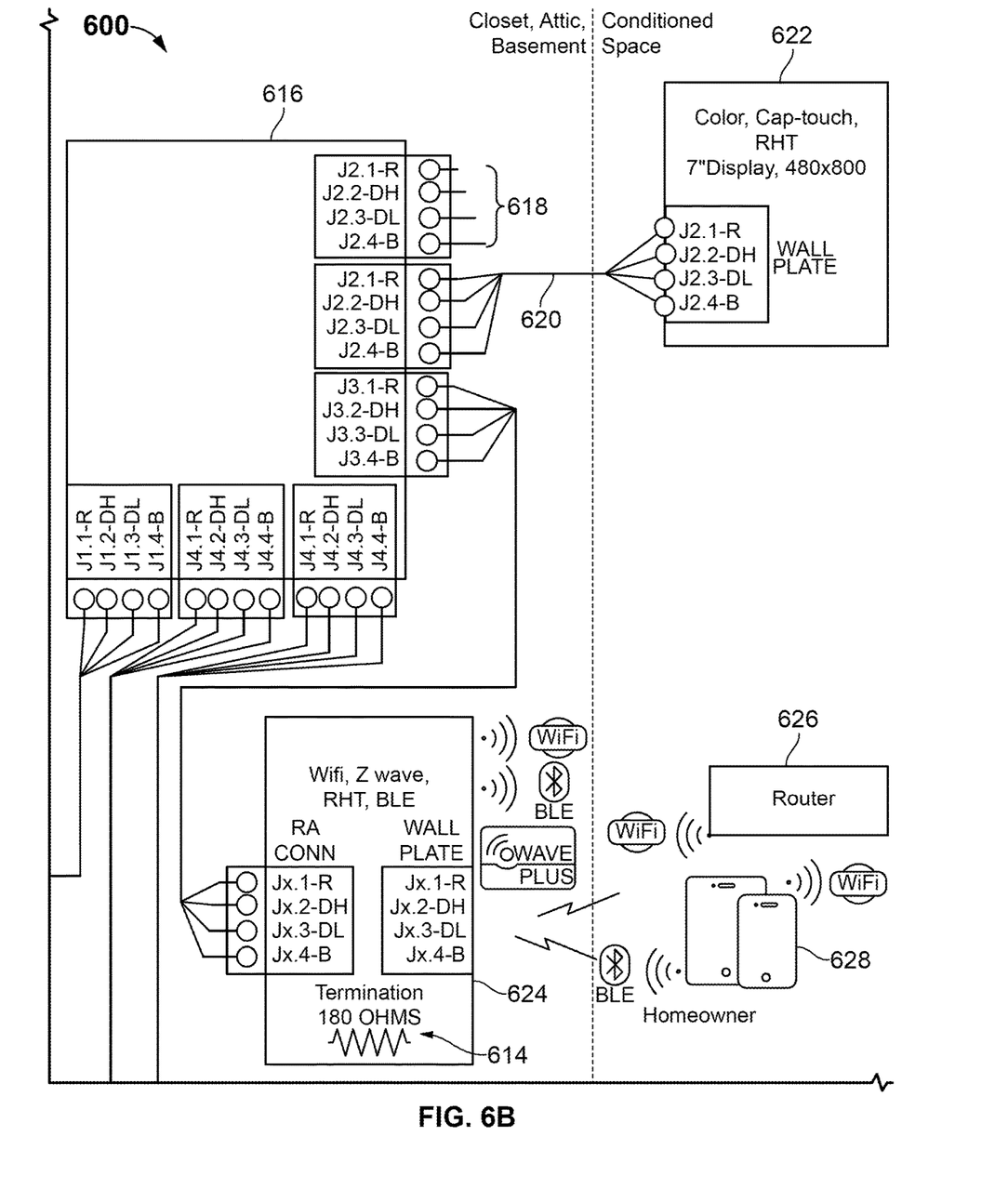
Figure 6C:
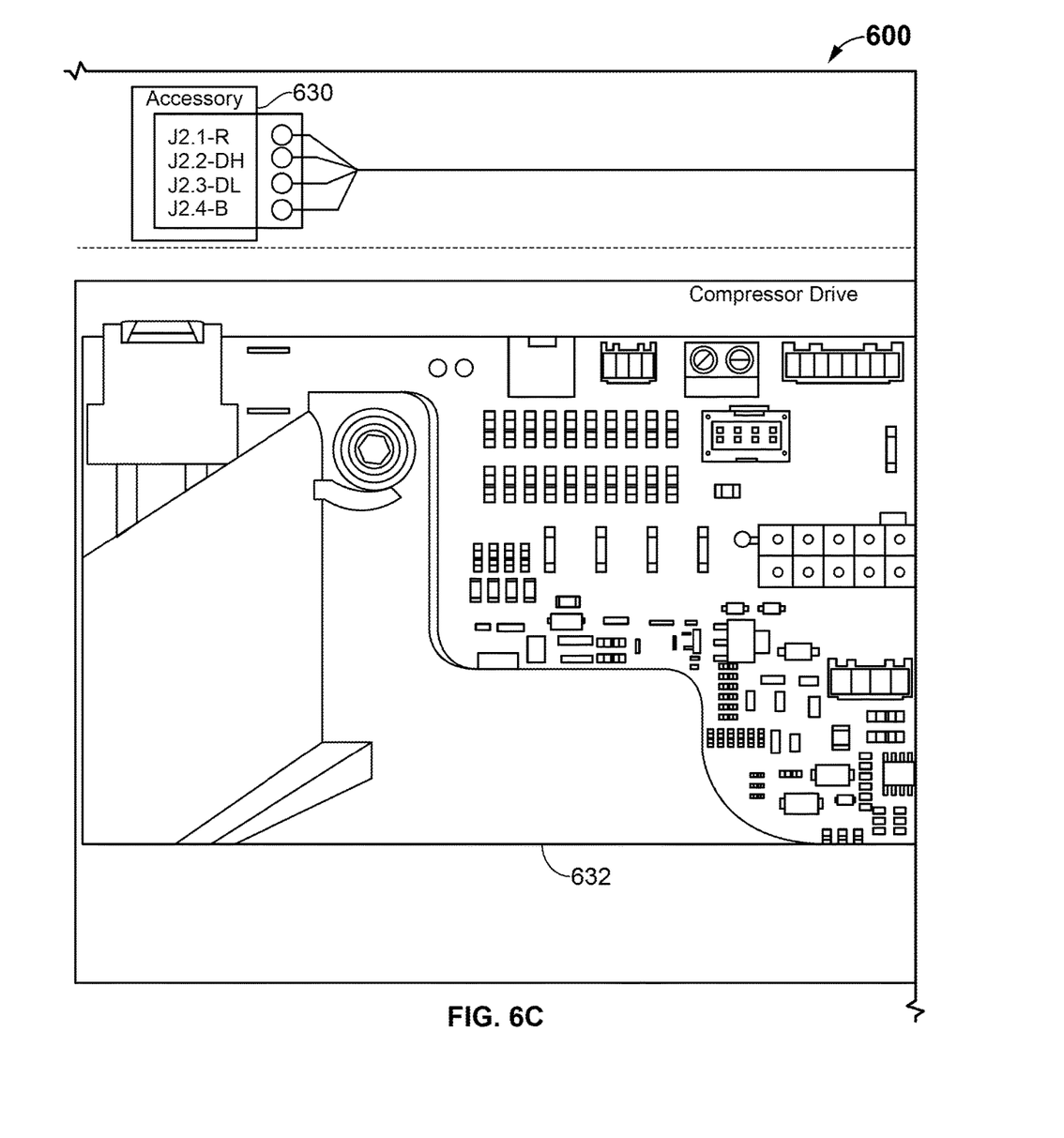
Figure 6D:
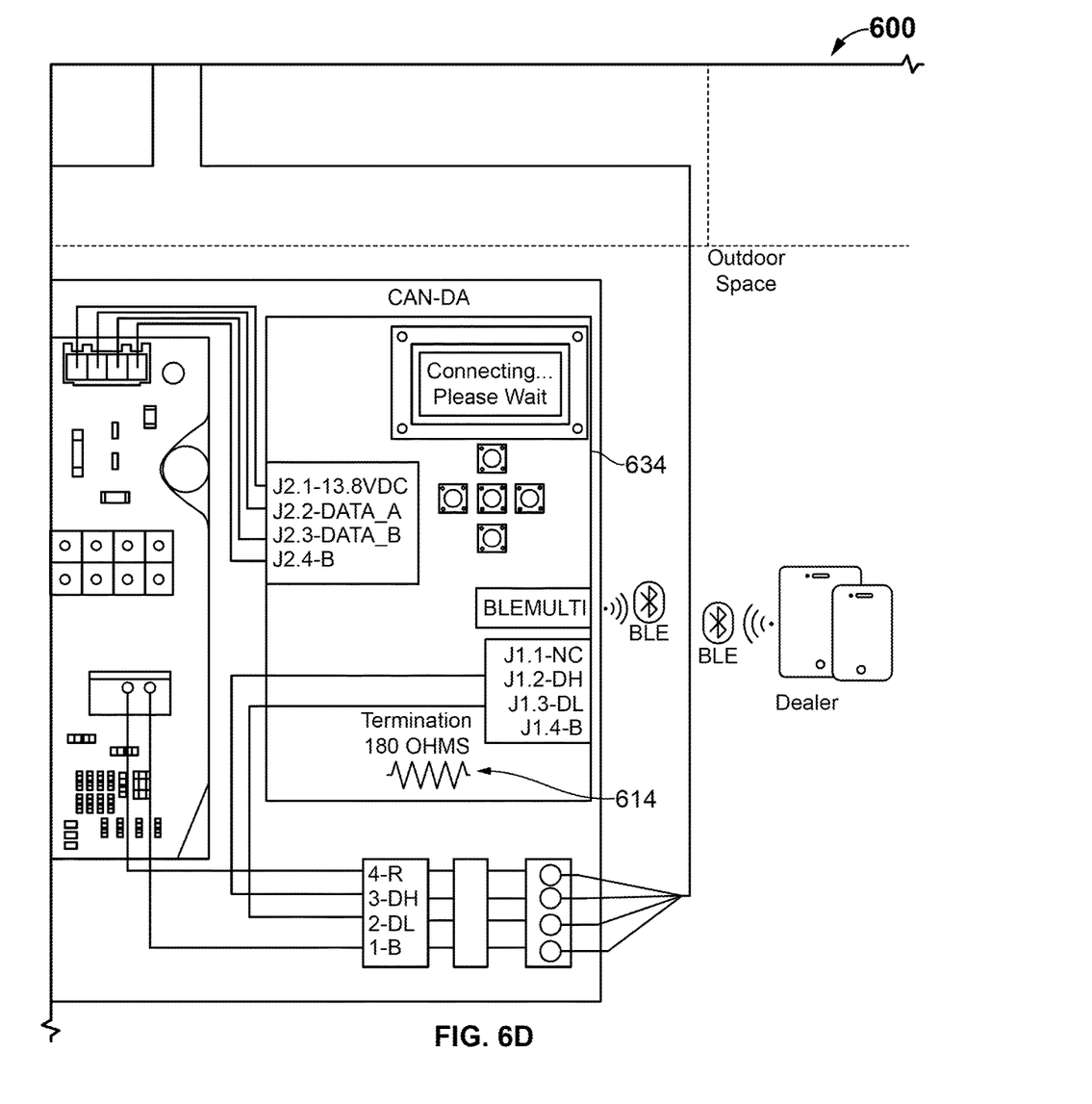

FIG. 5 illustrates an exemplary method 500 for providing a CAN Network Topology according to an embodiment of the present disclosure. The method 500 comprises a step 502 of determining at least three primary hubs suitable for installing one or more end nodes. The method 500 comprises a step 504 providing a predetermined termination level at each primary hub. The method 500 comprises a step 506 installing one or more end nodes without the need for physically setting node terminations. The method 500 comprises a step 508 of enhancing signal integrity by optimizing rise and fall times of the end nodes via the predetermined termination level.

As the majority of installations have three essential pieces of equipment including an outdoor unit, an indoor unit and a thermostat, the present disclosure utilizes at least three primary nodes. The outdoor unit may include an A/C condensing unit or a heat pump unit providing condensing operation in cooling (A/C) mode and evaporating operation in heating mode. The indoor unit may include an A/C evaporating unit or a dual- or tri-mode air handler that provides evaporating in cooling mode, condensing in heating mode, and/or concurrent evaporating and condensing in dehumidification mode. The thermostat may include a smart thermostat with graphic user interface (UI), and a UI control panel used with one or more environmental sensors (e.g., temperature, relative humidity, barometric pressure, and the like).

Each primary end node comprises a 180Ω termination impedance, which provides acceptable reduction of reflections (e.g., voltage standing wave ratio or "VSWR") when used in the disclosed star configuration with secondary endpoint nodes. This eliminates the need for an installation technician to have the skill, or spend the time, to adjust termination settings in each node, as practiced in the prior art. Consistency and reliability are improved, and fault detection and diagnosis is simplified since the variable termination permutations of prior art systems is removed from the disclosed system. Manufacturing costs are also reduced since termination resistors are pre-set in the primary nodes, thereby eliminating the need for DIP switches or other configuration means, nor for termination resistors in the secondary nodes.

Examples of secondary endpoint (non-terminated) equipment suitable for use with the disclosure, include, but not limited to, temperature and/or humidity sensors, dampers, zoning kits, user interface panels, network bridges (to access internet, cloud, mobile app), air cleaners (electrostatic), humidifiers, dehumidifiers, heat recovery ventilators (HRV), energy (or enthalpy) recovery ventilators (ERV), fuel level sensors, weather sensors, demand-response interface and backup power interface.

FIG. 6A-6D illustrates a wiring diagram of an exemplary HVAC system 600 constructed according to an embodiment of the present disclosure. The HVAC system 600 includes a distributor hub 616 that couples the various components of the HVAC system 600. The distributor hub 616 is connected to a plurality of network devices including at least three primary nodes and one or more secondary end nodes 630 via one or more network cables 620. Each primary end node comprises 180Ω termination resistor 614, which provides acceptable reduction of reflections (VSWR) when used in a star configuration with endpoint of secondary node 630. The distributor hub 616 is also connected to an end node user interface 622. The end node user interface 622 could be a display or touch screen. At least three primary nodes include an indoor unit such as an air handler 602, an outdoor unit and a wireless interface 624, and the secondary node 630 could be a damper, zoning kit and air cleaner. The air handler 602 is configured to condition and circulate air and may include heating and/or cooling elements.

The HVAC system 600 may include non-network devices such as a power transformer or indoor transformer (XFMR) 604, pressure sensor, static pressure sensor 606, electric heat relay panel 608, blower or variable speed (VSPD) motor 610. Additionally, HVAC system 600 includes communication (COMM) and status (STATUS) indicators 612 and spare connectors 618. The air handler 602 is associated with the outdoor unit. The outdoor unit includes a compressor drive 632 and associated condenser coils that are typically connected to an associated evaporator coil in the air handler 602 by a refrigerant line. A control unit 634 controls the air handler 602 and/or the compressor drive 632 to regulate the temperature of the premises. The HVAC system 600 further comprises wireless interface 624 to provide a communication medium between the components of HVAC system 600 or the user device such as router 626, mobile device 628 associated with the user. Mobile device 628 may include a mobile application component installed thereon. In one embodiment, the wireless interface 624 may be a Wi-Fi, Z-Wave, Bluetooth, Bluetooth Low Energy (BLE), or Zigbee wireless interface.

Advantageously, the present disclosure eliminates the need for a technician to set or adjust CAN node terminations. This reduces installation time and removes variability from the installation settings. Removing this variability may in turn reduce the likelihood of post-installation call-backs due to incorrect system setup. The present disclosure optimizes signal slew rate, which improves signal reliability. This present disclosure provides a best compromise for a wide range installation scenarios expected in HVAC systems. The addition of new accessories (nodes) requires no additional termination or configuration under the principles of the present disclosure.

Particular embodiments of the present disclosure have been described herein, however, it is to be understood that the disclosed embodiments are merely examples of the disclosure, which may be embodied in various forms. Well-known functions or constructions are not described in detail to avoid obscuring the present disclosure in unnecessary detail. Therefore, specific structural and functional details disclosed herein are not to be interpreted as limiting, but merely as a basis for the claims and as a representative basis for teaching one skilled in the art to variously employ the present disclosure in any appropriately detailed structure.

What is claimed is:

1. A heating, ventilation, and air conditioning (HVAC) system that is configured to provide conditioned air when set up in an installation, the HVAC system comprising:
    an outdoor unit and an indoor unit configured to provide condensing and evaporating operations to condition air that is moved through the HVAC system, and additional components configured to support operation of the HVAC system to provide the conditioned air; and
    transceiver circuits coupled to respective ones of the indoor unit, the outdoor unit and the additional components, the transceiver circuits coupled together in a controller area network (CAN) in which at least three of the transceiver circuits are primary nodes, and others of the transceiver circuits are end nodes, the primary nodes coupled together and having a predetermined termination impedance, and the end nodes are coupled to one or more of the primary nodes and are without a termination impedance that is set or adjusted based on the installation.

2. The HVAC system of claim 1, wherein the primary nodes are coupled together in a mesh network topology, and the end nodes are coupled to one or more of the primary nodes in a star network topology.

3. The HVAC system of claim 1, wherein the predetermined termination impedance is predetermined independent of the installation.

4. The HVAC system of claim 1, wherein the predetermined termination impedance is 180 ohms.

5. The HVAC system of claim 1, wherein the predetermined termination impedance is in a range of 50 ohms to 200 ohms.

6. The HVAC system of claim 1, wherein at least some of the end nodes are non-terminated.

7. The HVAC system of claim 1, wherein the transceiver circuits are coupled together in the CAN that is a building automation communications network.

8. The HVAC system of claim 1, wherein the transceiver circuits are coupled together in the CAN that includes a CAN bus through which the transceiver circuits are interconnected, and the predetermined termination impedance of each primary node is provided by a termination resistor circuit that is coupled to the CAN bus.

9. The HVAC system of claim 8, wherein the termination resistor circuit includes a termination resistor that is selectively coupled to the CAN bus via an electronic switch.

10. The HVAC system of claim 1, wherein the additional components include a thermostat, and one or more of a damper, a heat recovery ventilator (HRV), an energy recovery ventilator (ERV), a sensor, a zoning kit, a user interface panel, a network bridge, an air cleaner, a humidifier or a dehumidifier, and
    wherein the primary nodes include those of the transceivers coupled to the outdoor unit, the indoor unit and the thermostat.

11. A method of setting up a heating, ventilation, and air conditioning (HVAC) system that is configured to provide conditioned air when set up in an installation, the method comprising:
    setting up an outdoor unit and an indoor unit configured to provide condensing and evaporating operations to condition air that is moved through the HVAC system, and additional components configured to support operation of the HVAC system to provide the conditioned air; and
    coupling together transceiver circuits that are coupled to respective ones of the indoor unit, the outdoor unit and the additional components, the transceiver circuits coupled together in a controller area network (CAN) in which at least three of the transceiver circuits are primary nodes, and others of the transceiver circuits are end nodes, the primary nodes coupled together and having a predetermined termination impedance, and the end nodes are coupled to one or more of the primary nodes and are without a termination impedance that is set or adjusted based on the installation.

12. The method of claim 11, wherein the primary nodes are coupled together in a mesh network topology, and the end nodes are coupled to one or more of the primary nodes in a star network topology.

13. The method of claim 11, wherein the predetermined termination impedance is predetermined independent of the installation.

14. The method of claim 11, wherein the predetermined termination impedance is 180 ohms.

15. The method of claim 11, wherein the predetermined termination impedance is in a range of 50 ohms to 200 ohms.

16. The method of claim 11, wherein at least some of the end nodes are non-terminated.

17. The method of claim 11, wherein the transceiver circuits are coupled together in the CAN that is a building automation communications network.

18. The method of claim 11, wherein the transceiver circuits are coupled together in the CAN that includes a CAN bus through which the transceiver circuits are interconnected, and the predetermined termination impedance of each primary node is provided by a termination resistor circuit that is coupled to the CAN bus.

19. The method of claim 18, wherein the termination resistor circuit includes a termination resistor that is selectively coupled to the CAN bus via an electronic switch.

20. The method of claim 11, wherein the additional components include a thermostat, and one or more of a damper, a heat recovery ventilator (HRV), an energy recovery ventilator (ERV), a sensor, a zoning kit, a user interface panel, a network bridge, an air cleaner, a humidifier or a dehumidifier, and
    wherein the primary nodes include those of the transceivers coupled to the outdoor unit, the indoor unit and the thermostat.

* * * * *